United States Patent
Kazama

(10) Patent No.: US 6,873,168 B2
(45) Date of Patent: Mar. 29, 2005

(54) CONDUCTIVE COIL CONTACT MEMBER

(75) Inventor: Toshio Kazama, Nagano (JP)

(73) Assignee: NHK Spring Co., Ltd., Nagano (JP)

( * ) Notice: Subject to any disclaimer, the term of this patent is extended or adjusted under 35 U.S.C. 154(b) by 0 days.

(21) Appl. No.: 10/892,642

(22) Filed: Jul. 15, 2004

(65) Prior Publication Data
US 2004/0257099 A1 Dec. 23, 2004

Related U.S. Application Data

(62) Division of application No. 09/909,523, filed on Jul. 20, 2001, now Pat. No. 6,781,390.

(51) Int. Cl.$^7$ .............................................. G01R 31/02
(52) U.S. Cl. ...................................................... 324/754
(58) Field of Search ................................ 324/754, 756, 324/757, 761, 762, 765, 158.1; 174/68.1, 267

(56) References Cited

U.S. PATENT DOCUMENTS

| | | | | |
|---|---|---|---|---|
| 6,043,666 A | * | 3/2000 | Kazama | 324/754 |
| 6,150,616 A | * | 11/2000 | Kazama | 174/267 |
| 6,341,962 B1 | * | 1/2002 | Sinclair | 439/66 |
| 6,377,059 B2 | * | 4/2002 | Vinther et al. | 324/754 |
| 6,452,406 B1 | | 9/2002 | Beaman et al. | |

FOREIGN PATENT DOCUMENTS

| | | |
|---|---|---|
| JP | 63-293845 | 11/1988 |
| JP | 08-203644 | 8/1996 |

* cited by examiner

*Primary Examiner*—David Zarneke
*Assistant Examiner*—Tung X. Nguyen
(74) *Attorney, Agent, or Firm*—MacPherson Kwok Chen & Heid LLP; David S. Park

(57) ABSTRACT

In a conductive coil contact member having at least one tapered end consisting of a plurality of turns of coil wire having a progressively smaller coil radius toward a free end thereof, the coil wire comprises a core wire and at least one highly electrically conductive layer formed over the core wire, a last turn of the coil wire at the free end having a smaller coil radius than would be possible by coiling the coil wire. Thus, the core wire is coiled to a smallest possible radius in the last turn, and the coil wire diameter is thereafter increased by forming layers formed by plating or other similar methods. The final result is that the last turn of the coil wire at the free end has a smaller coil radius than would be possible by coiling the coil wire. The reduction in the coil radius of the last turn contributes to the improvement in the positional accuracy of the free end of the tapered end of the conductive coil contact member.

9 Claims, 16 Drawing Sheets

CONDUCTIVE COIL CONTACT MEMBER

CROSS-REFERENCE TO RELATED APPLICATIONS

This is a divisional application of U.S. patent application Ser. No. 09/909,523, filed Jul. 20, 2001, now U.S. Pat. No. 6,781,390 which is herein incorporated by reference for all purposes.

TECHNICAL FIELD

The present invention relates to a conductive coil contact member suitable for use in contact probes and contact cards for testing semiconductor devices and wafers, electric sockets for devices in such forms as LGA (land grid array), BGA (ball grid array), CSP (chip side package) and bare chip, and electric connectors. The present invention also relates to a contact probe head using a conductive coil contact member.

BACKGROUND OF THE INVENTION

Conventionally, various forms of conductive contact members have been used in electrically testing (open/short circuit tests, environmental tests, burn-in tests and so forth) electroconductive patterns of printed circuit boards and electronic components, and have been widely used in contact probes for testing wafers, electric sockets for semiconductor devices in such forms as LGA, BGA, CSP and bare chip, and connectors.

In applications to electric sockets for semiconductor devices, for instance, there is a trend for using higher signal frequencies for semiconductor devices, and frequencies in the order of hundreds of MHz have become very common. In a socket for a semiconductor device which operates under such high frequency signals, the conductive contact member which forms a part of the electrically conductive path for the device is required to have an even lower inductance and resistance. For instance, U.S. Pat. No. 6,043,666 issued Mar. 26, 2000 to T. Kazama discloses a coil spring having a closely wound conical end which serves as a contact member so that the contact member and compression coil spring are integrally combined, and the inductance and resistance are reduced.

In addition to the need to reduce the electric inductance and resistance, it is desired to ensure the positional accuracy of each contact member with respect to the object to be contacted particularly when a large number of such conductive contact members are arranged in a support member to access a large number of points at the same time.

A conductive coil contact member allows the electric inductance and resistance to be minimized, but causes some difficulty in achieving the positional accuracy of its tip with respect to the object to be contacted. The tip is formed by conically winding a coil wire, but the last turn of the coil wire has a certain radius, and the position of the tip of the cone or the highest point of the cone could be anywhere along the last turn which is offset from the axial center of the cone by this radius. In short, the position of the tip of a conically wound contact member is offset from the axial center of the cone by a distance equal to the radius of the last turn of the coil wire.

Such an offset can be reduced by reducing the radius of the last turn, but it is difficult to reduce the radius of a turn beyond a certain limit for a given diameter of the coil wire. If a coil wire having a small diameter is used, it is possible to reduce the radius of the turn, but the desired resiliency or rigidity of the contact member may not be achieved, and the electric inductance and resistance inevitably increase.

U.S. Pat. No. 6,043,666 discloses a conductive coil contact member having each coil wire end formed into a pin extending centrally in the axial direction. Such an arrangement permits the positional accuracy of each tip to be increased without any limit in theory, but becomes impractical when the size of the conductive coil contact member is reduced beyond a certain level.

BRIEF SUMMARY OF THE INVENTION

In view of such problems of the prior art, a primary object of the present invention is to provide a conductive coil contact member which demonstrates a low electric inductance and resistance while providing a high level of positional accuracy for the contact point thereof.

A second object of the present invention is to provide a conductive coil contact member which provides a high level of positional accuracy for the contact point thereof but is easy and economical to manufacture.

A third object of the present invention is to provide a conductive coil contact member which demonstrates both mechanically and electrically favorable properties.

A fourth object of the present invention is to provide an improved contact probe using a conductive coil contact member.

According to the present invention, such objects can be accomplished by providing a conductive coil contact member having at least one tapered end consisting of a plurality of turns of coil wire having a progressively smaller coil radius toward a free end thereof, wherein: the coil wire comprises a core wire and at least one highly electrically conductive layer formed over the core wire, a last turn of the coil wire at the free end having a smaller coil radius than would be possible by coiling the coil wire.

Thus, the core wire is coiled to a smallest possible radius in the last turn, and the coil wire diameter is thereafter increased by forming layers formed by plating or other similar methods. The final result is that the last turn of the coil wire at the free end has a smaller coil radius than would be possible by coiling the coil wire. The reduction in the coil radius of the last turn contributes to the improvement in the positional accuracy of the free end of the tapered end of the conductive coil contact member.

According to a preferred embodiment of the present invention, a plurality of layers are formed over the core wire, the layers including at least one highly electrically conductive layer, made of such material as silver, copper and alloy of such a material, and at least one layer having a favorable mechanical property such as nickel. The outer layer may consist of material which is resistant to corrosion and oxidization such as gold, rhodium and alloy of such material. The core wire may be made of material having a favorable spring property such as steel.

The electrically conductive layer may either simply cover the coil wire or may continuously extend between adjacent turns of the coil wire so that a favorable electric path extending in the axial direction may be achieved instead of a spiral path.

The present invention also provides a contact probe head, comprising: a holder consisting of at least one plate member and having at least one holder hole extending across a thickness of the plate member; and a conductive coil contact member received in the holder hole, the coil contact member having a first tapered coil end consisting of a plurality of turns of coil wire having a progressively smaller coil radius toward a free end thereof, an intermediate coil spring potion including a coarsely wound section, and a second coil end which also consists of a tapered coil end consisting of a plurality of turns of coil wire having a progressively smaller coil radius toward a free end thereof, the free end of the second tapered coil end being soldered to a terminal of an external base board.

The soldering connection for the second tapered end ensures both the positional stability and favorable electric property of the conductive coil contact member. Because of the conical shape of the second tapered end, it is possible to ensure a stable connection even if the amount of applied solder is small owing to the small cross sectional area of the free end of the second tapered end, and prevent the solder from reaching the compression coil spring portion and impairing the spring function thereof owing to the capability of the second tapered end to retain a pool of solder inside the tapered turns of the coil wire.

Similar results can be achieved if the second coil end consists of a plurality of turns of coil wire wound radially inwardly substantially in a plane perpendicular to an axial line of the coil contact member so as to define a substantially flat end surface, instead of a tapered end.

In such a contact probe head, for the ease of soldering work and other assembly processes, it is desirable to be able to retain each conductive coil contact member in the corresponding holder hole while allowing the conductive coil contact member to be installed in the holder hole without any substantial difficulty. To achieve this goal, according to a certain aspect of the present invention, the contact probe head of the present invention may comprise a holder consisting of at least one plate member and having at least one holder hole extending across a thickness of the plate member; a conductive coil contact member received in the holder hole; and means for resiliently retaining the contact member in the holder hole.

The retaining means may comprise a section of the conductive coil contact member having a slightly larger coil outer diameter than a corresponding inner diameter of the holder hole, or a plurality of radial projections provided in a part of the holder hole such as an open end thereof, a circle defining by inscribing free ends of the radial projections being slightly smaller than a corresponding coil outer diameter of the conductive coil contact member. Alternatively, the retaining means may comprise a plurality of radial projections extending over a substantial length of the holder hole on an inner circumferential surface of the holder hole, and a section of the conductive coil contact member having a slightly larger coil outer diameter than a circle defining by inscribing free ends of the radial projections.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
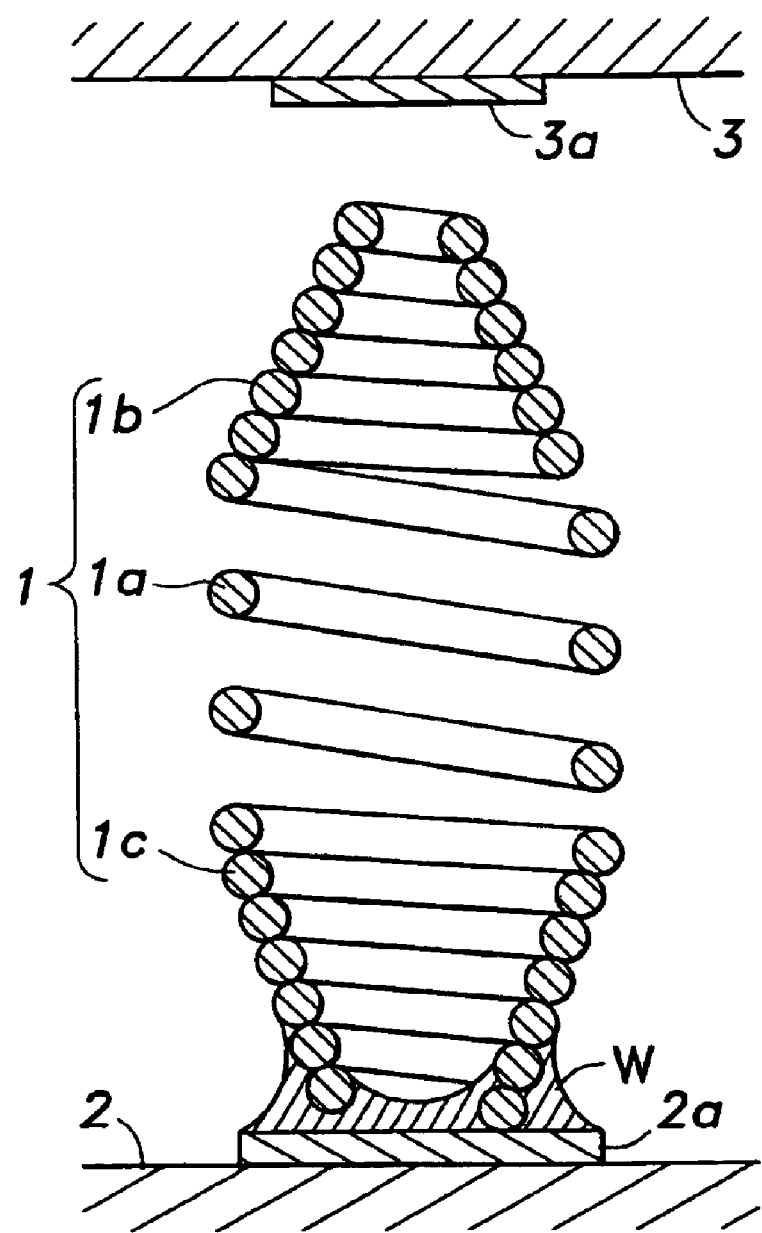
FIG. 1 is a sectional side view of a conductive coil contact member embodying the present invention.

FIG. 1 is a sectional view of a conductive coil contact member 1 embodying the present invention. The conductive coil contact member 1 comprises a cylindrical coil spring portion 1a wound at a prescribed pitch in an intermediate part thereof and a pair of conical electrode portions 1b and 1c each consisting of a closely wound portion and having a small diameter end facing outward. The lower electrode portion 1c as seen in the drawing is soldered to a circuit terminal 2a of a printed circuit board 2. An IC chip 3 is placed opposite the upper electrode portion 1b.

An electric connection can be established by moving the chip 3 downward as seen in the drawing until the upper electrode portion 1b comes into contact with a pad 3a of the IC chip 3, and the coil spring portion 1a is resiliently compressed. The tip of the electrode portion 1b can be thus engaged with the pad 3a with a certain resilient force so that a favorable electric contact can be ensured between the electrode portion 1b and pad 3a with an adequate contact pressure.

Figure 2:
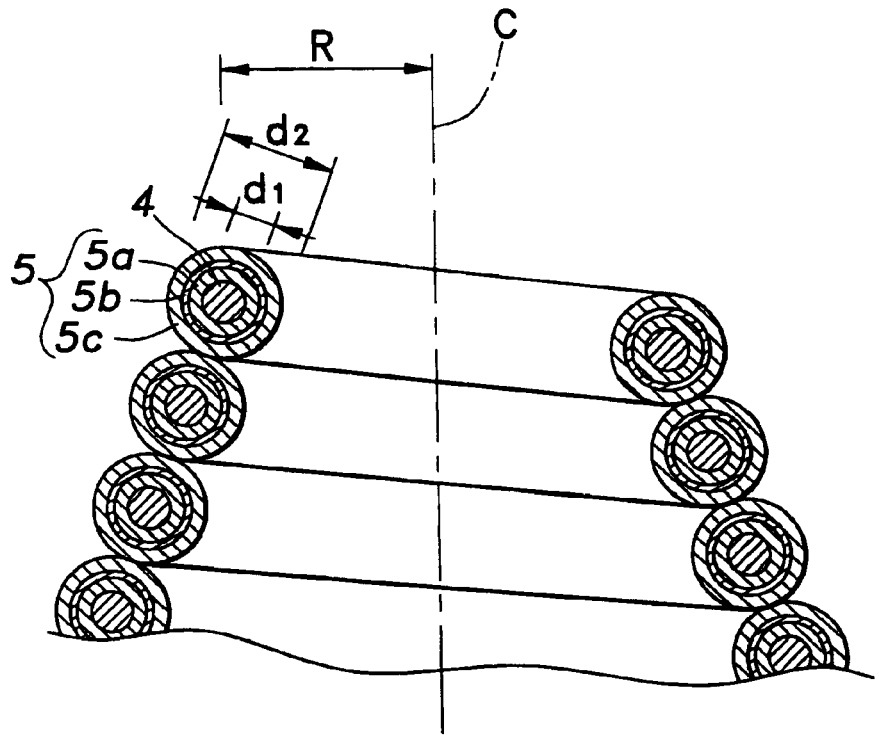
FIG. 2 is a enlarged fragmentary sectional view of an upper end of the conductive coil contact member shown in FIG. 1.

According to the illustrated conductive contact member 1, the two coil ends are formed by winding a coil wire 5 into a conical shape with their pointed ends facing away from each other. As shown in FIG. 2, the coil wire 5 consists of a core wire 4 and three plated layers 5a, 5b and 5c formed over the surface of the core wire 4. In other words, the diameter $d_2$ of the coil wire 5 is substantially greater than the diameter $d_1$ of the core wire 4. This coil wire 5 is formed by coiling the core wire 4 into a conical shape, and the last turn on the small diameter end is formed so as to have as small a radius as possible for the given wire diameter of the core wire 4. The three plated layers 5a, 5b and 5c are formed one after another after the core wire 4 is coiled to a prescribed shape. The plated layers can be formed any known methods of forming such layers, and such method may include, not exclusive, electroplating, electroless plating, dipping, sputtering, CVD, PVD and thermal spraying. As can be readily appreciated, as the wire diameter increases, the minimum radius that can be given to a turn increases. This radius R achieved by using the core wire 4 having the wire diameter $d_1$ is therefore substantially smaller than that would be achieved by using a core wire having the diameter $d_2$.

When the conical electrode portion is brought into contact with an object, for instance, having a flat contact surface, the point of contact may be anywhere along the last turn of the coil. In other words, the positional accuracy of the contact point is no less than the radius R of the last turn of the coil at the coil end, and, therefore, can be improved by reducing the radius R.

For instance, when the wire diameter of the core wire 4 is 110 μm, it is very difficult to reduce the coil radius below 140 μm, but a coil radius of 115 μm was achieving by using a coil wire having a wire diameter of 90 μm. Therefore, the contact point was brought closer to the axial center C by 25 μm.

Figure 3:
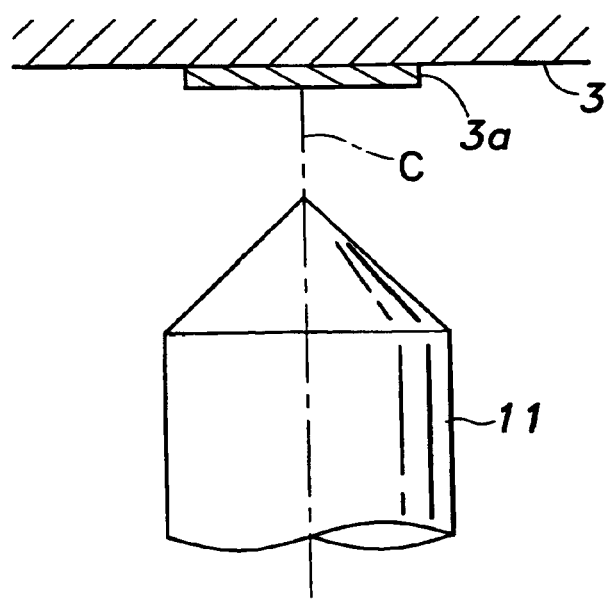
FIG. 3 is a schematic side view showing the conventional conductive contact member.

In case of a conductive contact member in the form of a needle member 11, an error in the positional accuracy of the contact point can be reduced substantially without any limit as shown in FIG. 3. However, in case of a conductive contact member in the form of a coil spring, the coil end may be shaped into a conical shape to minimize the positional error, but the error cannot be reduced any more than the radius of the last turn of the coil. The error could be reduced by forming the coil end so as to place the wire end at the axial center, but it becomes increasingly difficult as the coil diameter gets smaller, and, even if it is possible, increases the manufacturing cost.

According to the foregoing embodiment, the conductive coil contact member was coiled so as to achieve a small radius for the last turn of the coil wire by using a core wire having a small diameter. Therefore, the contact point can be brought close to the axial center of the conductive coil contact member, and the positional error in the contact point can be minimized. According to a presently preferred embodiment of the present invention, the core wire is made of a material having a favorable mechanical property such as steel, and at least one of the plated layers 5a, 5b and 5c is made of a low electric resistance material.

When the coil wire is coiled into a conical shape, any radial gap between adjacent turns causes an excessive axial deflection of the coil spring so that the coil wire should be coiled in a conical shape while ensuring a certain radial overlap between adjacent turns of the coil wire. Therefore, if the wire diameter is small, the coil wire must be coiled into a conical shape having a relatively small cone angle, and this increases the axial length of the conical part of the coil spring. This also increases the length of the electrically conductive path, and compromises the compact design of such a conductive coil contact member. When the effective wire diameter is increased by forming plated layers 5a, 5b and 5c, the radial overlap between the adjacent turns of the coil can be ensured while allowing a relatively large cone angle or a relatively small length for the conical part of the conductive coil contact member, According to a particularly preferred embodiment of the present invention, the lower plated layer consists of silver or copper having a low electric resistance, the middle layer consists of nickel which prevents the diffusion of the lower layer, and the upper layer consists of gold or rhodium having a resistance to oxidization and corrosion. The nickel layer also contributes to the improvement in the mechanical property such as resiliency of the conductive coil contact member.

Figure 4:
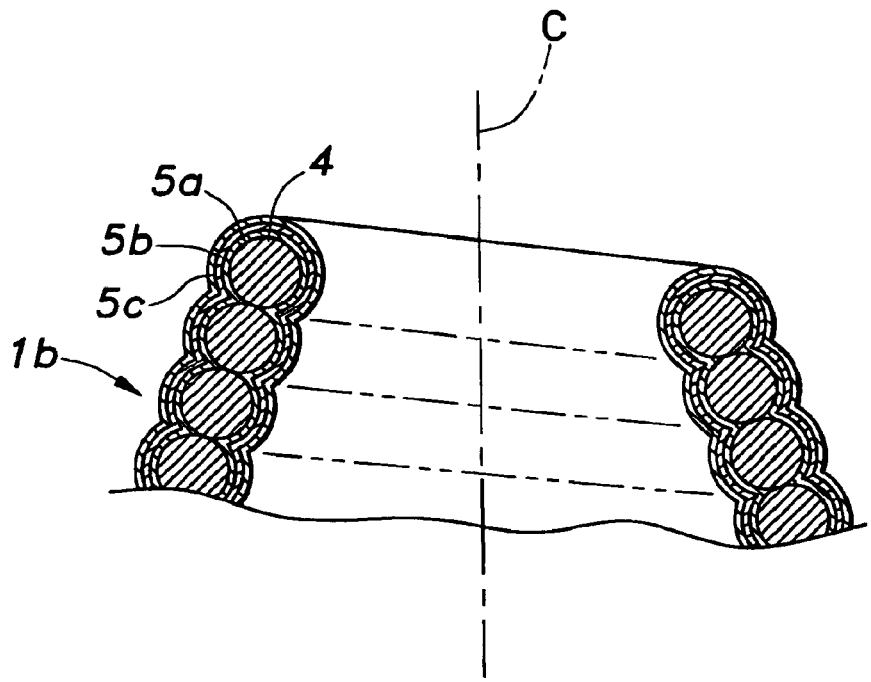
FIG. 4 is a view similar to FIG. 2 showing an alternate embodiment of the present invention.

The number of plated layers may be selected at will, and a single plated layer may also be employed to implement the concept of the present invention. The thickness of each layer may be selected at will depending on the nature of the selected material, and the particular application of the conductive coil contact member. For instance, silver or copper which has a lower electric resistance and is less expensive than gold can be formed into a thick plated layer which may be in the order of a few μm to tens of μm in thickness. The plated layer additionally contributes to the reduction in the contact resistance, improvement in mechanical properties, improvement in durability and preventing oxidization. The plating may be performed to the core wire before it is coiled, or after it is coiled. The plated layer or layers typically hamper the coiling of the coil wire into a turn having a small radius less than would a solid coil wire or core wire having a comparable diameter as the plated coil wire. It is also possible to perform the plating both before and after it is coiled. FIG. 4 shows the case where three plated layers 5a, 5b and 5c are formed after the core wire 4 has been coiled to a prescribed conical shape. Because the adjacent turns of the coil wire in the electrode portion 1b are joined to one another by the plated layers, the electrode portion 1b behaves, at least electrically, as if it were made of a solid conical shell.

In this conductive coil contact member 1, the electrode portion 1c is soldered to the circuit terminal 2a of the circuit board 2a. This soldering eliminates any contact resistance which inevitably arises between two mutually abutting parts, and provides an accurate positioning of the conductive coil contact member. It may also eliminate the need for an additional fastening means such as threaded bolts.

Figure 5:
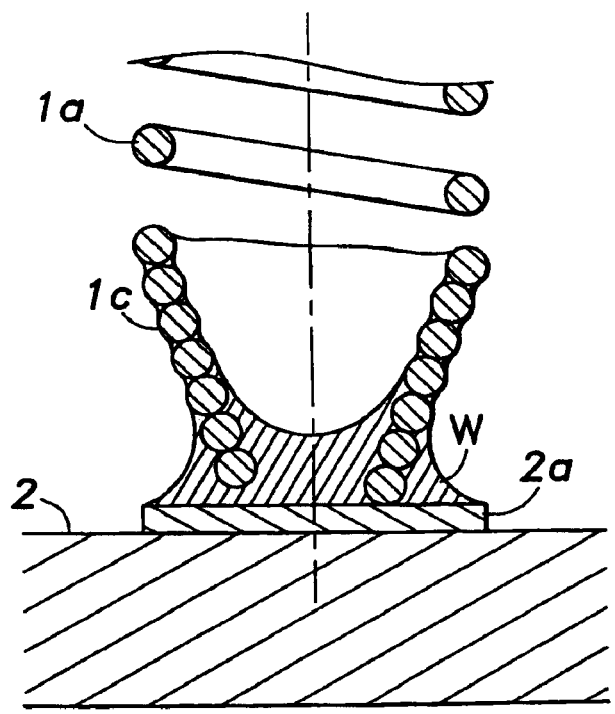
FIGS. 5 and 6 are fragmentary sectional views showing a lower conical section of the conductive coil contact member to explain the reasons for the high level of tolerance on the amount of solder.
Figure 6:
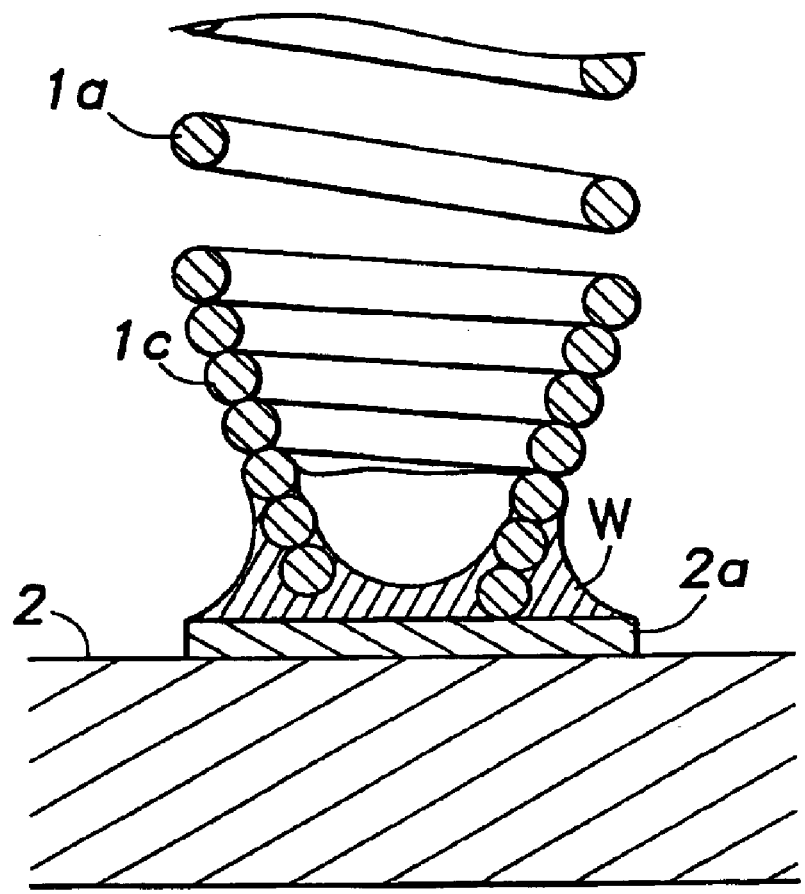

Referring to FIGS. 5 and 6, this embodiment provides a high level of tolerance for the amount of solder that is used for securing the electrode portion 1c to the circuit terminal 2a. Because the free end of the conical electrode portion 1c has a small diameter, it can be soldered to the circuit terminal 2a even when a very small amount of solder is used. Conversely, if a larger amount of solder is used, the solder rises upward along the coil wire owing to the wettability of the coil wire (or the capillary action) with respect to the solder, but because of the conical shape of the electrode portion, the solder is pooled inside the electrode portion 1b. This latter tendency opposes the tendency of the solder to rise upward along the electrode portion 1b. This is desirable because if the solder reaches the coil spring portion 1b, the resiliency of the conductive coil contact member 1 would be impaired. In case of a cylindrical electrode portion or a conical electrode portion having a larger radius at its free end, there is a less tendency for the solder to be pooled inside the electrode portion, and the solder has a greater tendency to rise along the electrode portion. In short, achieving a small radius for the free end of the conical electrode portion provides the advantage of increasing the tolerance for the amount of solder that is used for attaching the conical electrode portion 1c to a circuit terminal 2a or the like.

At any event, according to this embodiment, it is possible to cover the surface of the electrode portion 1c with solder substantially in a continuous manner without requiring any accurate control of the amount of solder so that the contact resistance that may be present between adjacent turns of the coil wire can be substantially reduced owing the solder layer providing an alternate electrically conductive path, and the electric signal is allowed to be conducted substantially along the axial direction of the conical electrode portion 1c, instead of along a spiral path. This obviously contributes to the reduction in the electric inductance and resistance of the conductive coil contact member 1.

Figure 7:
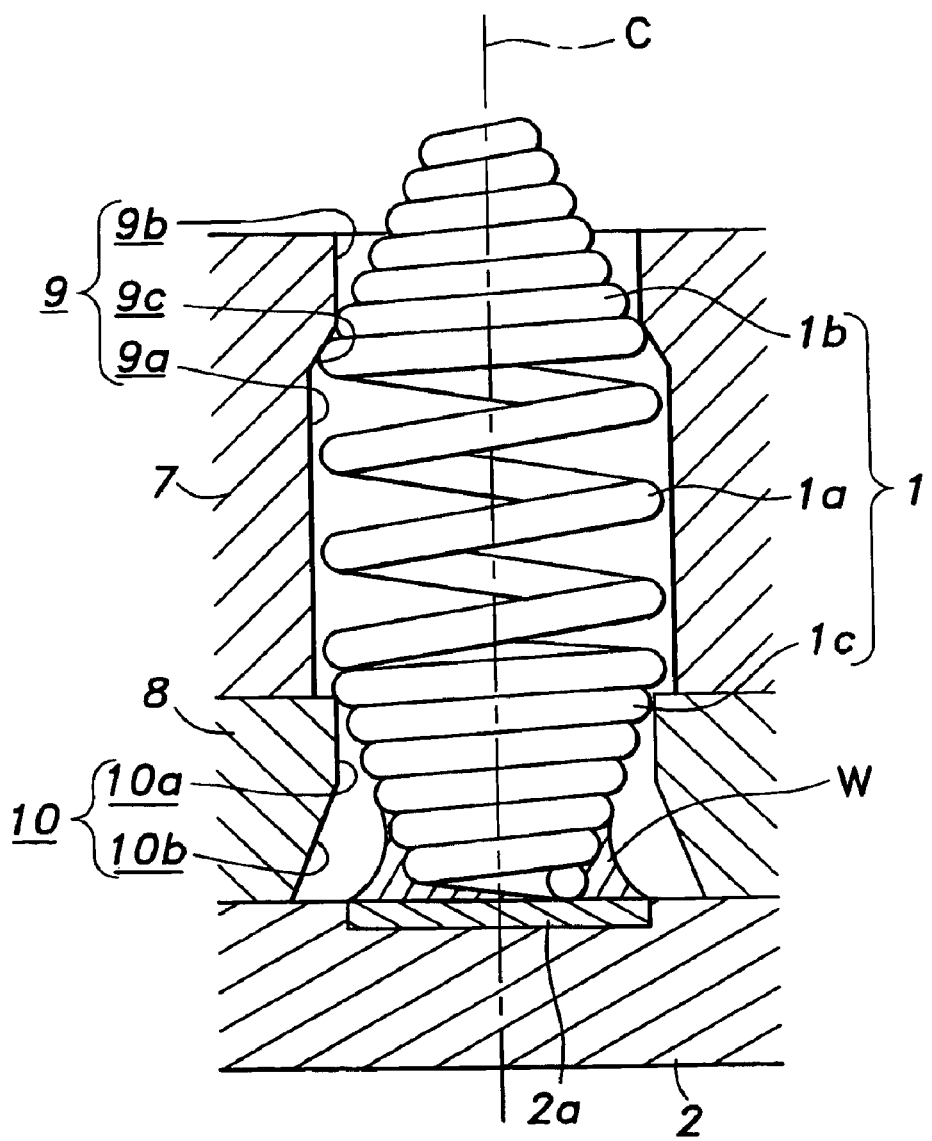
FIG. 7 is a sectional side view of a contact probe head embodying the present invention.

FIG. 7 shows a contact probe head using such a conductive coil contact member. This contact probe head comprises a holder formed by a pair of insulating plate members 7 and 8 integrally joined one over the other using threaded bolts, bonding agent or the like (not shown in the drawing), and the insulating plate members 7 and 8 are formed with through holes 9 and 10, respectively, which are aligned with each other and jointly form a holder hole. Only one set of through holes 9 and 10 are shown in the drawings, but a large number of such sets of through holes are typically formed in the holder. These through holes 9 and 10 receive a conductive coil contact member 1 as described above.

The upper through hole 9 as seen in the drawing comprises a large diameter portion 9a extending from the lower end over a large part of the thickness of the upper insulating plate member 7, an upper small diameter portion 9b having a relatively small length at an upper open end of the through hole 9, and a tapered portion 9c connecting the two portions in a smooth manner. The coil spring portion 1a of the conductive coil contact member 1 having a cylindrical profile is received in the large diameter portion 9a, and the tapered portion 9c engages a base end of the conical electrode portion 1b of the contact member 1 and restricts the outward movement of the contact member 1 to such an extent as to permit a free end of the upper conical electrode portion 1b to project out of the small diameter portion 9b by a prescribed length and the axial line of the conductive coil spring member 1 is automatically aligned with the axial center C of the through hole 9.

The lower through hole 10 comprises a small diameter portion 10a facing the large diameter portion of the through hole 9 in the upper insulating plate 7, and a tapered portion 10b having a small diameter end connected to the small diameter portion 10a and a large diameter end opening at the lower surface of the lower insulating plate member 8. The annular shoulder defined between the two through holes 9 and 10 engages the lower conical electrode portion 1c to restrict the downward movement of the electrode portion 1c. Thus, the contact member 1 is retained in the support hole jointly defined by the two through holes 9 and 10 in a pre-stressed state with the free ends of the upper and lower conical electrode portions projecting from the corresponding openings of the support hole each by a prescribed length.

The holder assembly consisting of the two insulating plate members 7 and 8, is placed over the circuit board 2, and is joined thereto by threaded bolts, a bonding agent or the like. The free end of the lower electrode portion 1c which resiliently abuts a circuit terminal 2a of the circuit board 2 is soldered thereto as indicated by W. The lower end of the tapered portion 10b is so dimensioned as to expose the circuit terminal 2a even when the lateral relative positioning between the holder and the circuit board 2 is not perfect.

Figure 8:
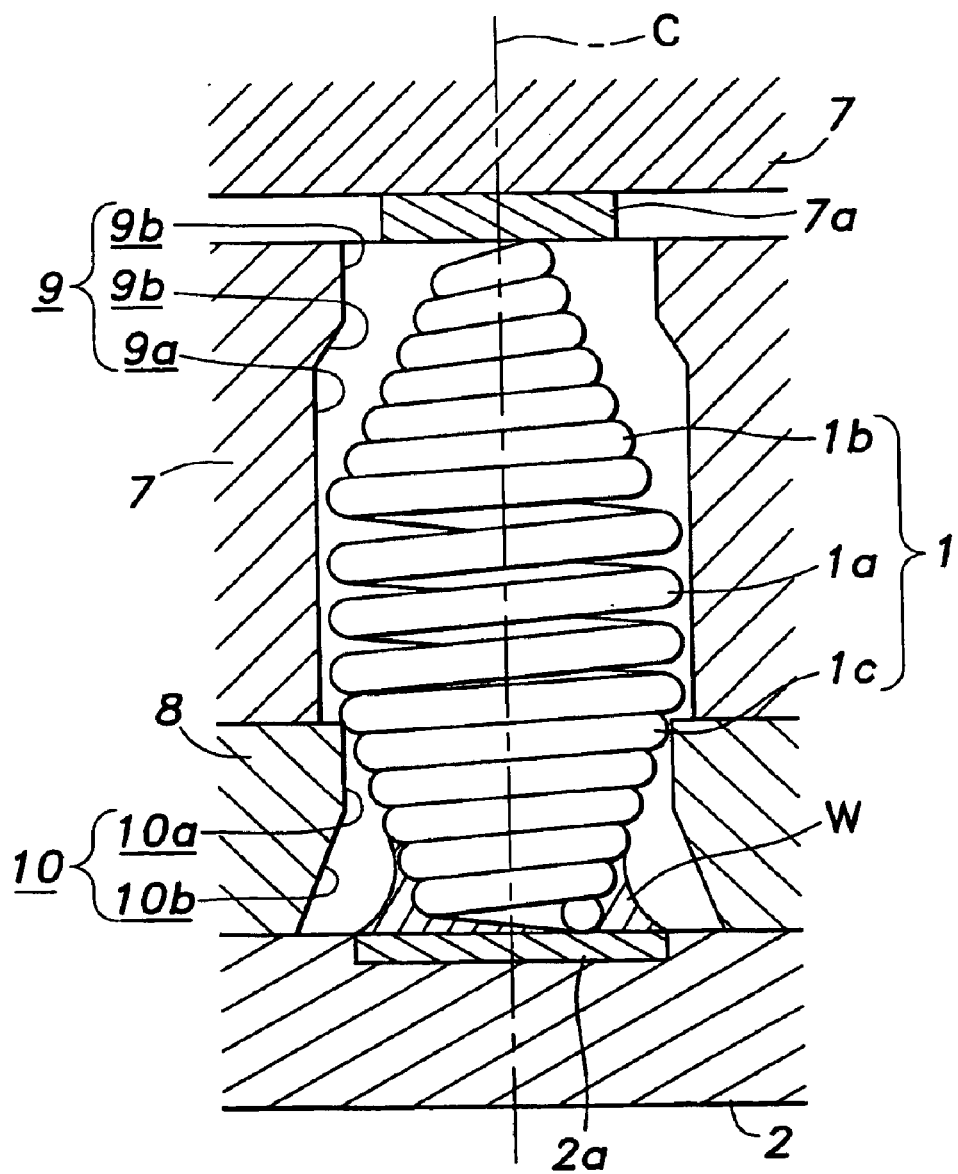
FIG. 8 is a view similar to FIG. 7 showing the embodiment shown in FIG. 7 in actual use.

FIG. 8 shows the assembly shown in FIG. 7 when it is applied to a pad 7a of an IC chip 7 which is desired to be tested. The assembly is moved toward the IC chip 7, and retained at a prescribed short distance therefrom by a fixture not shown in the drawing. Thus, the free end of the upper electrode portion 1b engages the pad 7a with a prescribed loading, and an adequate contact pressure is established between the electrode portion 1b and the pad 7a.

Figure 9:
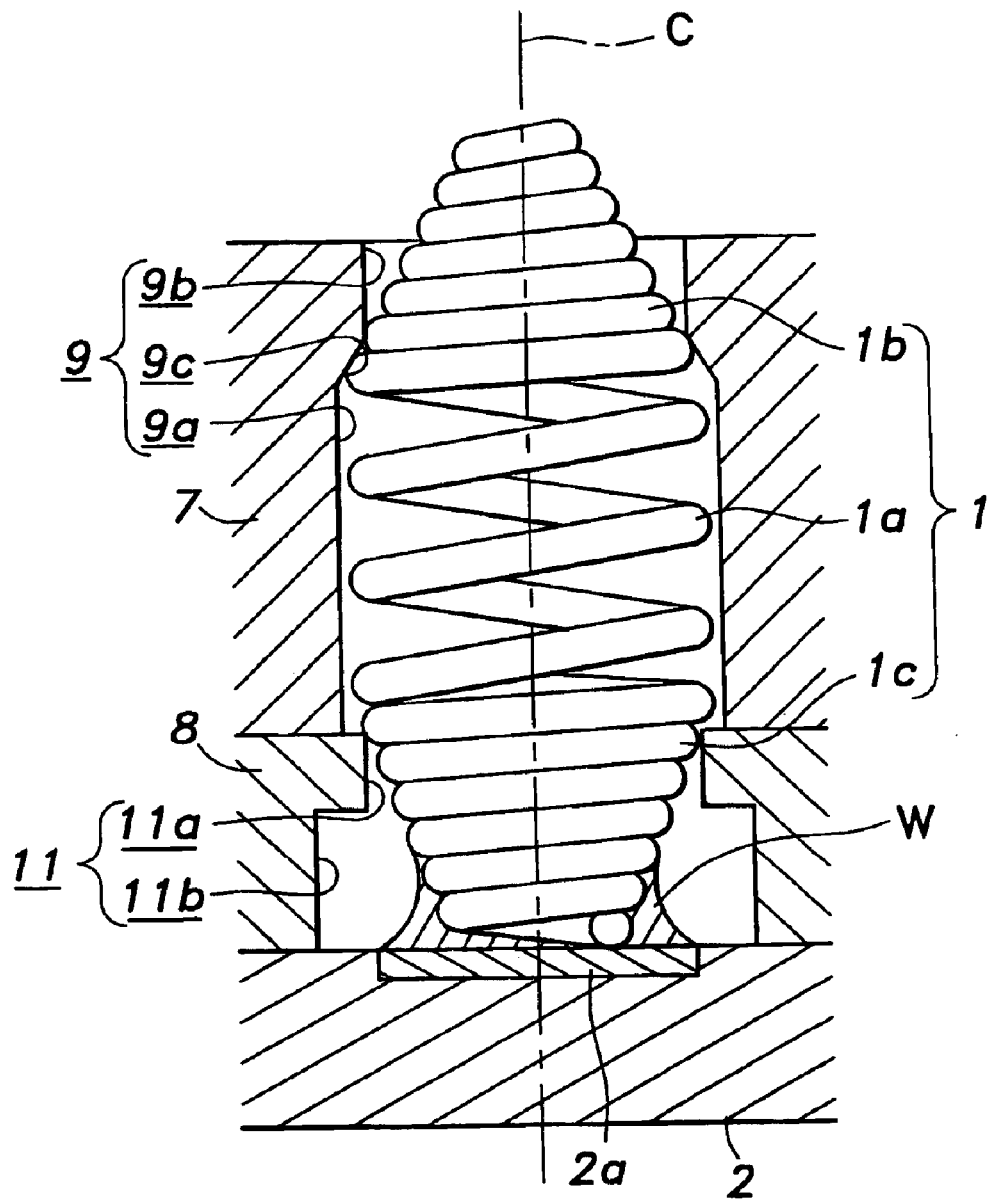
FIGS. 9 to 13 are views similar to FIG. 7 showing different embodiments which are modified from that shown in FIG. 7.

FIG. 9 shows a second embodiment of the present invention in which the parts corresponding to those of the previous embodiment are denoted with like numerals. In this embodiment, the through hole 9 of the insulating plate member 7 facing away from the circuit board 2 is not different from that of the previous embodiment, but the through hole 11 formed in the lower insulating plate 8 on the side of the circuit board 2 consists of a small diameter portion 11a similar to that shown in FIG. 7 and a large diameter portion 11b provided on the side of the circuit board 2. The large diameter portion 11b is so dimensioned as to expose the circuit terminal 2a even when the lateral relative positioning between the holder and the circuit board 2 is not perfect. The large diameter portion 11a consists of a straight hole, and this simplifies the work of forming the hole.

Figure 10:
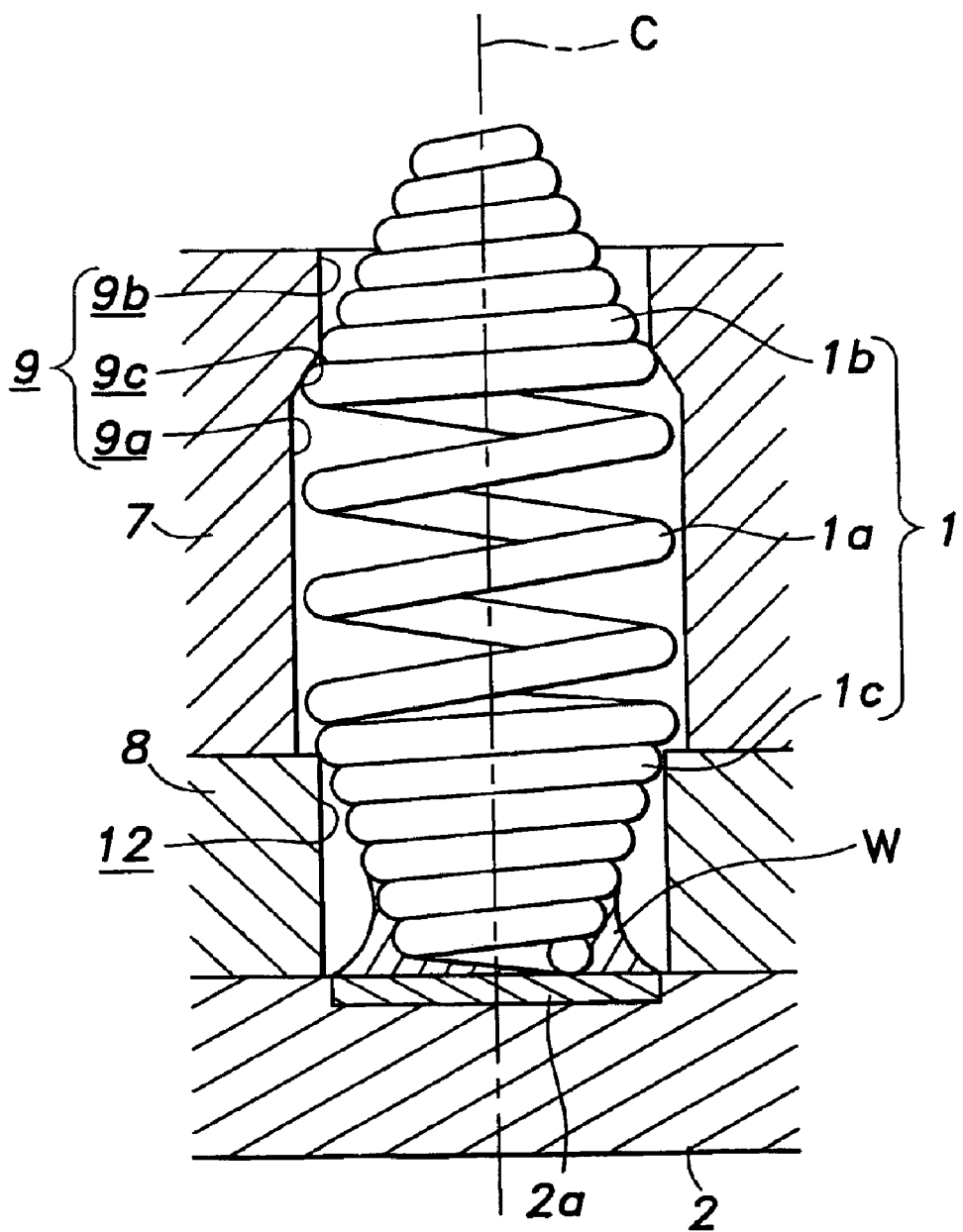

FIG. 10 shows a third embodiment of the present invention in which the parts corresponding to those of the previous embodiments are denoted with like numerals. In this embodiment, the through hole 9 of the insulating plate member 7 facing away from the circuit board 2 is not different from that of the previous embodiment, but the through hole 12 formed in the lower insulating plate 8 on the side of the circuit board 2 consists of a straight small diameter hole extending over the entire thickness of the insulating plate 8. This simplifies the work of forming the hole, and contributes to the reduction of the manufacturing cost.

Figure 11:
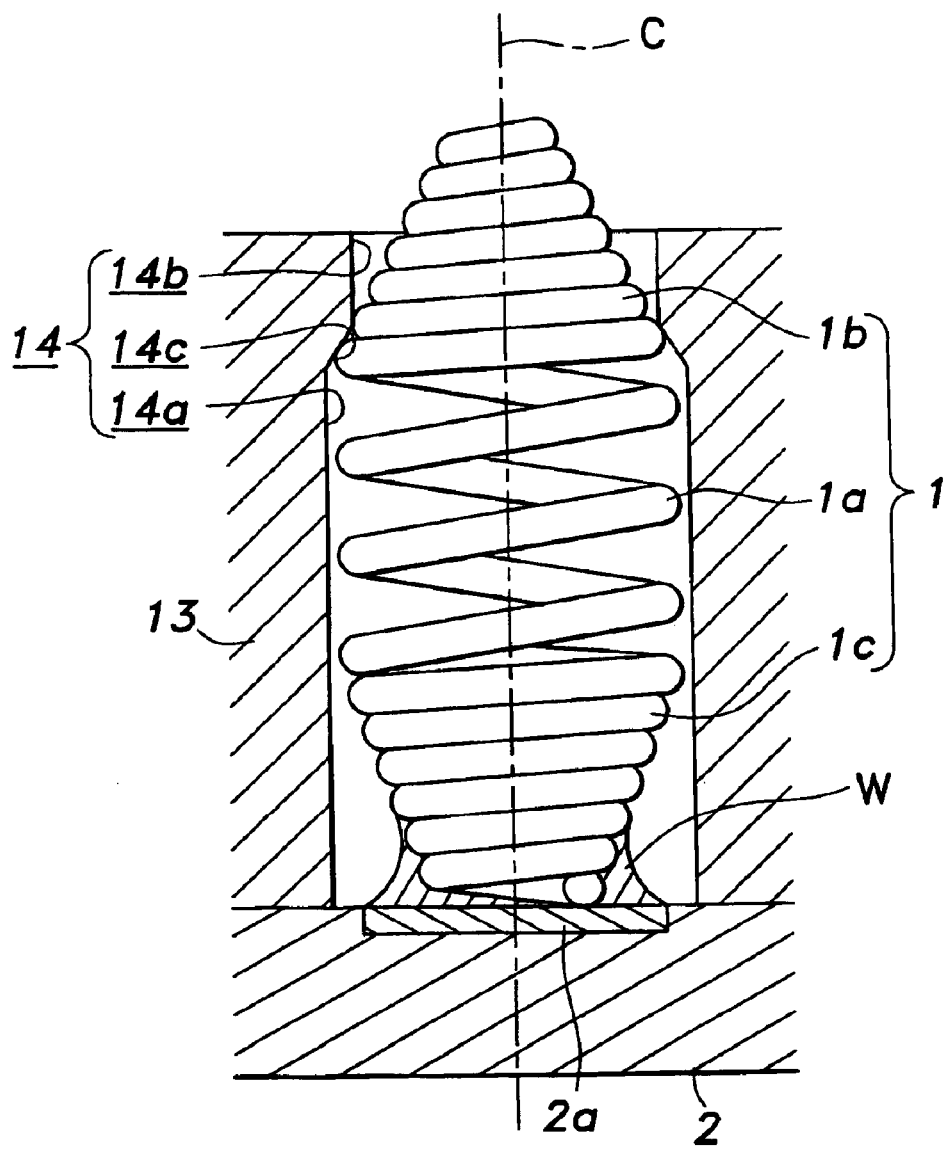

FIG. 11 shows a fourth embodiment of the present invention in which the parts corresponding to those of the previous embodiments are denoted with like numerals. In this embodiment, the holder in this case consists of a single insulating plate member 13 which is connected to the circuit board 2. A through hole 14 passed across the thickness of the insulating plate member 13 comprises a large diameter portion 1c extending from the end adjoining the circuit board 2 over a large part of the thickness of the insulating plate member 13, a small diameter portion 14b extending over a short distance from the end facing away from the circuit board 2, and a tapered portion 14c which smoothly connects the large diameter portion 14a and small diameter portion 14b together.

According to this embodiment, the holder for retaining the conductive coil contact member 1 can be simplified. Similarly as the embodiment illustrated in FIG. 7, the conical electrode portion 1b resiliently abuts the tapered portion 14c of the through hole so that the axial line of the conductive coil spring member 1 can be automatically aligned with the axial center C of the through hole 14, and the projecting length of the electrode portion 1b can be made uniform.

Figure 12:
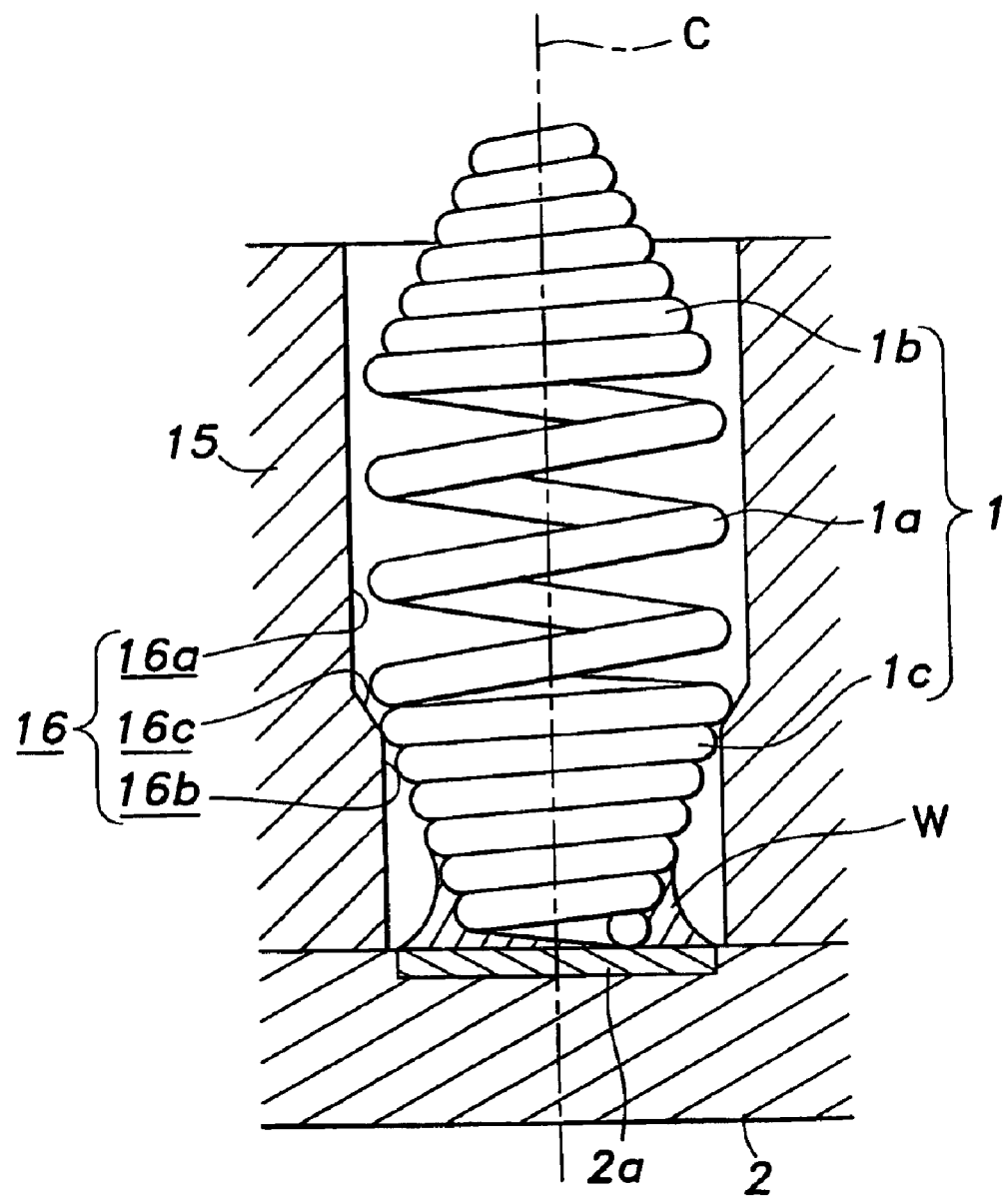

FIG. 12 shows a fifth embodiment of the present invention in which the parts corresponding to those of the previous embodiments are denoted with like numerals. In this embodiment, the holder in this case consists of a single plate member 15 which is placed closely over the circuit board 2. A through hole 16 passed across the thickness of the insulating plate member 15 comprises a large diameter portion 16a extending from the end facing away from the circuit board 2 over a large part of the thickness of the insulating plate member 15, a small diameter portion 16b extending over a short distance from the end adjacent to the circuit board 2, and a tapered portion 16c which smoothly connects the large diameter portion 16a and small diameter portion 16b.

According to this embodiment, simply by soldering the lower electrode portion 1c to the circuit terminal 2a, the lower electrode portion 1c is secured to the circuit board 2 with the maximum diameter portion of the lower electrode portion 1c engaged by the tapered portion 16c of the through hole 16. Therefore, according to this embodiment, the structure is highly simplified not only because the holder consists of a single insulating plate member 15 but also because the conductive coil contact member 1 secures the insulating plate member 15 to the circuit board 2 without requiring any threaded bolts or a bonding agent. This reduces the number of component parts and manufacturing steps so that the manufacturing cost can be minimized.

Figure 13:
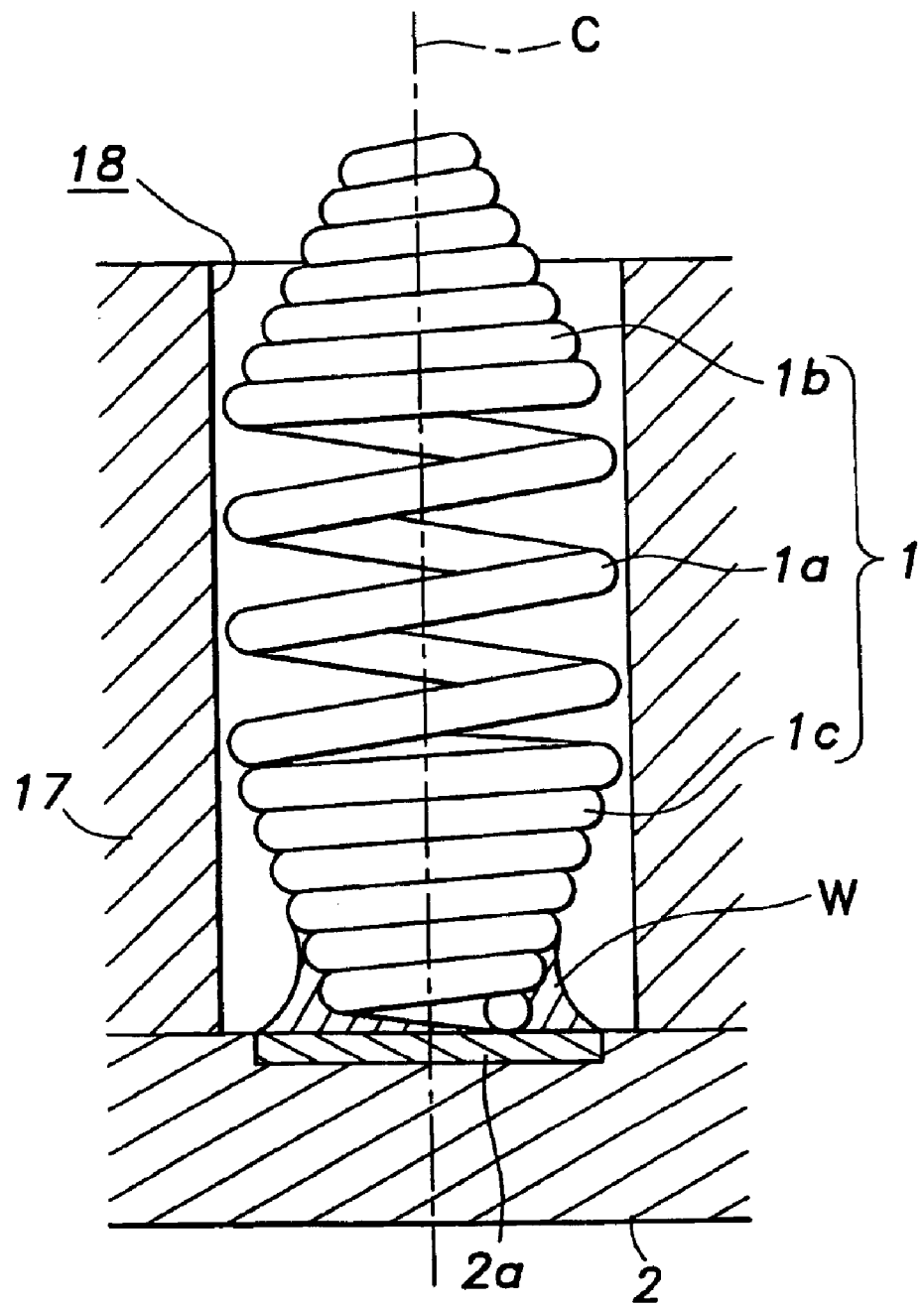

FIG. 13 shows a sixth embodiment of the present invention in which the parts corresponding to those of the previous embodiments are denoted with like numerals. In this embodiment, the holder in this case consists of a single plate member 17 which is connected to the circuit board 2. A through hole 18 is passed across the thickness of the insulating plate member 17. The through hole 18 in this case consists of a straight hole having a constant diameter which allows the coil spring portion 1a of the conductive coil contact member 1 to be guided in the axial direction. This embodiment simplifies the structure even further, and the manufacturing cost can be reduced accordingly.

Figure 14:
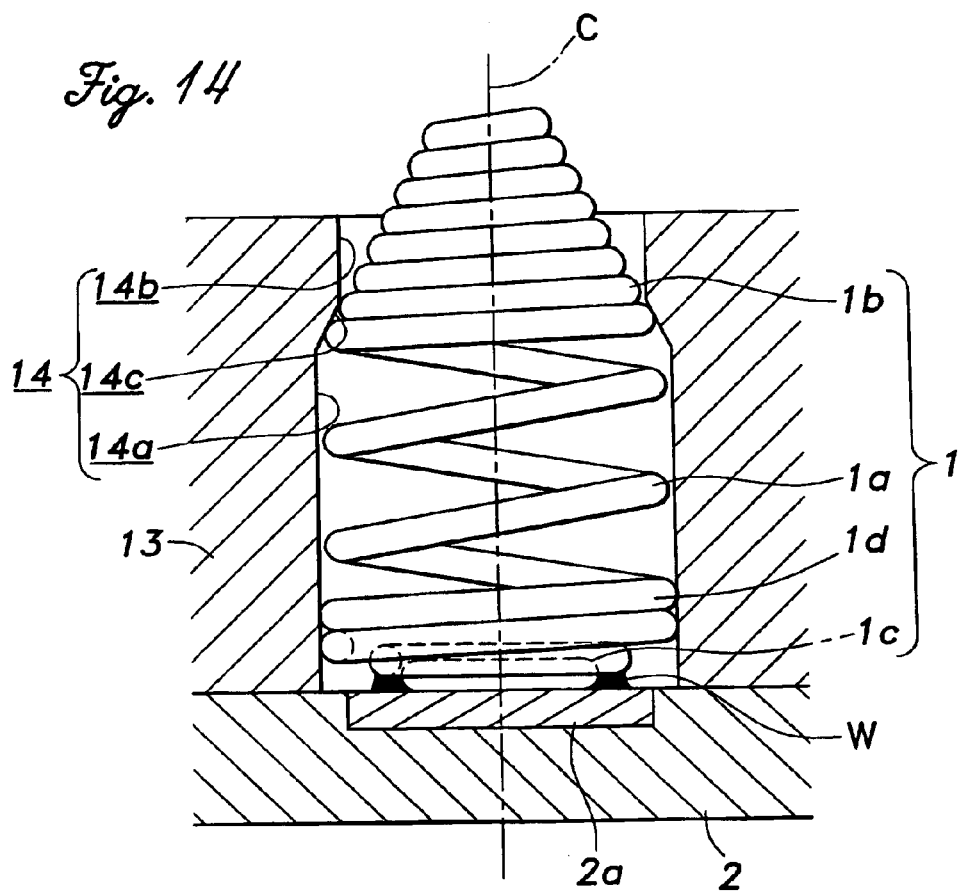
FIG. 14 is a sectional side view showing yet another embodiment of the contact probe head according to the present invention.

FIG. 14 shows a seventh embodiment of the present invention in which the parts corresponding to those of the previous embodiments are denoted with like numerals. In this embodiment, the holder hole 14 has a substantially identical shape as that of the embodiment illustrated in FIG. 11. The conductive coil contact member 1 is provided with a conical electrode portion 1b at its upper end as shown in the drawing, and a base end of the electrode portion 1b is engaged by the tapered portion 14c of the holder hole 14 so as to have its free end project out of the small diameter portion 14b of the holder hole 14 by a prescribed length. The conductive coil contact member 1 is additionally provided with an intermediate part consisting of a compression coil spring portion 14c which is coaxially received in the large diameter portion 14a of the holder hole 14 with a certain radial play.

The lower end of the conductive coil contact member 1 comprises a closely wound portion 1d having a relatively small axial length and connected to a lower end of the compression coil spring portion 1a, and a flat end portion 1c which is sharply reduced in diameter from the adjacent closely wound portion 1d by turning the coil wire radially inward in a plane perpendicular to the axial line of the conductive coil contact member 1. Therefore, the flat end portion 1c is provided with a relatively planar end surface by which the conductive coil contact member 1 abuts the circuit terminal 2a. This planar end surface enables the conductive coil contact member 1 to stand upright on the circuit terminal 2a and allows the soldering work to be performed in a stable manner.

Also, the solder fills into the gap between adjacent turns of the coil wire over the entire end surface of the flat end portion 1c of the conductive coil contact member 1 so that a mechanically stable soldering connection can be achieved on the one hand, and a favorable and stable electric connection can be established between the end surface of the conductive coil contact member 1 and the circuit terminal 2a.

The closely wound portion 1d is provided with a diameter which is somewhat greater than that of the compression coil spring portion 1a, and is slightly greater than the inner diameter of the large diameter portion 14a of the holder hole 14 so that when the conductive coil contact member 1 is placed inside the holder hole 14, the closely wound portion 1d is resiliently engaged by the inner circumferential surface of the large diameter portion 14a, and retains the conductive coil contact member 1 in the holder hole 14.

When assembling the conductive coil contact member 1 into the holder hole 14, the conductive coil contact member 1 is fitted into the holder hole 14 from the large diameter end of the holder hole 14 with the conical electrode portion 1b first. The closely wound portion 1d having a larger diameter than the large diameter portion of the holder hole 14 is resiliently engaged by the open end of the large diameter portion 14a, but can be pushed into the large diameter hole 14a by applying an inwardly pressure owing to the radially inward elastic deformation of the closely wound portion 1d. When the conductive coil contact member 1 is fully received in the holder hole 14, the conductive coil contact member 1 is firmly held in the holder hole 14, and this facilitates the assembly work. For instance, the soldering work can be performed with an electrode portion consisting of the flat end portion 1c facing downward. Thus, although the holder consists of a single plate member, the conductive coil contact member 1 is retained in the holder hole and prevented from being dislodged in either axial direction without complicating the structure of the holder.

Figure 15:
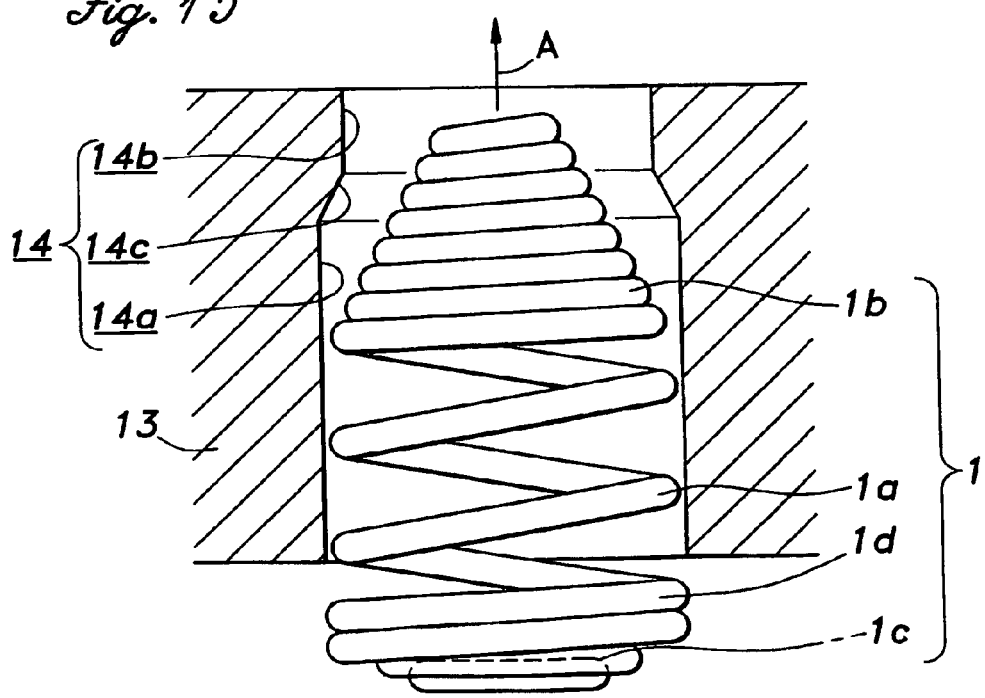
FIG. 15 is a view similar to FIG. 14 showing the mode of assembling the embodiment illustrated in FIG. 14.
Figure 16:
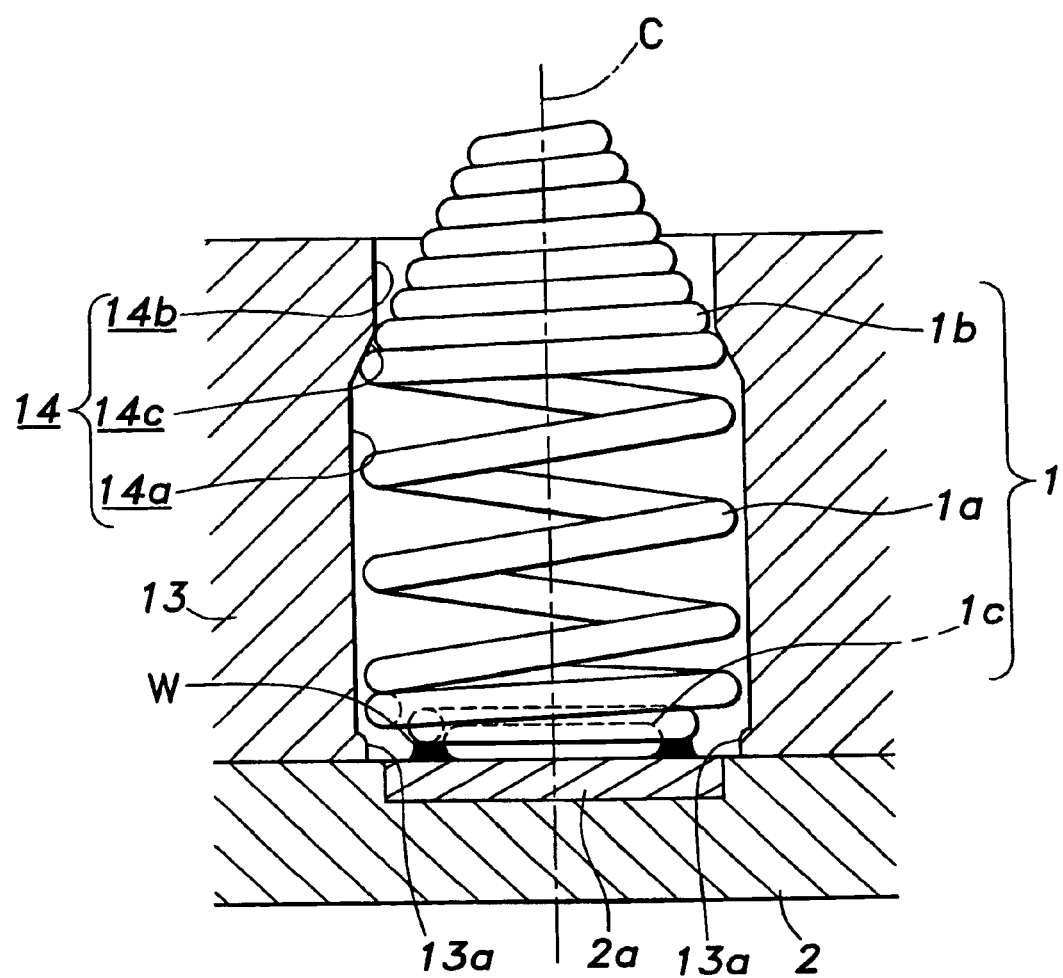
FIG. 16 is a view similar to FIG. 14 showing yet another embodiment of the contact probe head according to the present invention.
Figure 18:
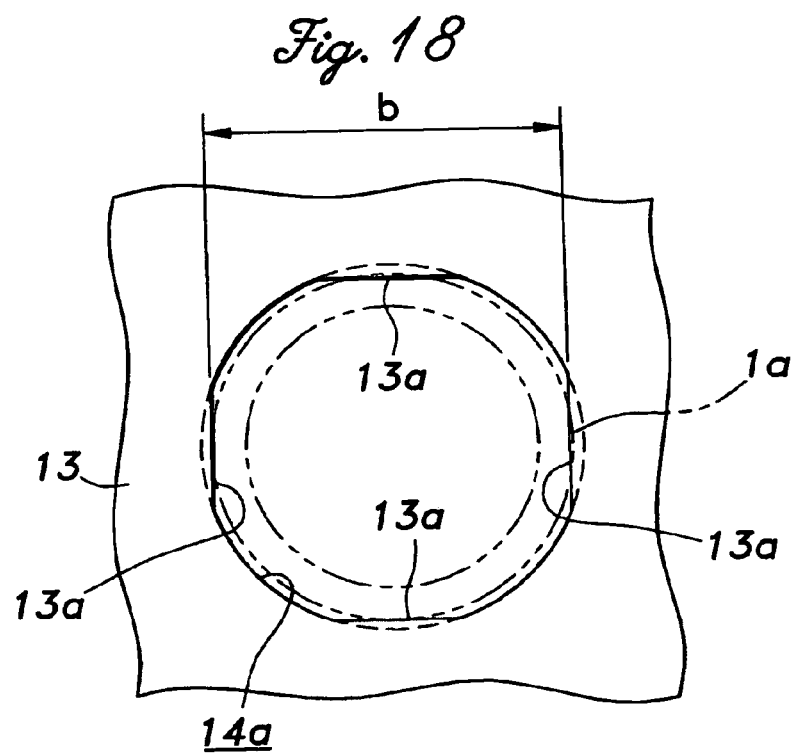
FIG. 18 is an end view as seen in the direction indicated by arrow XVIII in FIG. 17.

FIG. 16 shows an eighth embodiment of the present invention in which the parts corresponding to those of the previous embodiments are denoted with like numerals. In this embodiment which is similar to the previous embodiment illustrated in FIGS. 14 and 15, the conductive coil contact member 1 consists of an upper conical electrode portion 1b, an intermediate compression coil spring portion 1a, and a lower flat end portion 1c defining a flat coil end, and is not provided with a closely wound portion having a larger diameter than the inner diameter of the holder hole. Instead, the open end of the large diameter portion 14a of the holder hole 14 is provided with four radially inwardly directed projections 13a to define a gap b slightly smaller than the outer diameter of the compression coil spring portion 1a between each opposing pair of the projections 13a as shown in FIG. 18.

Figure 17:
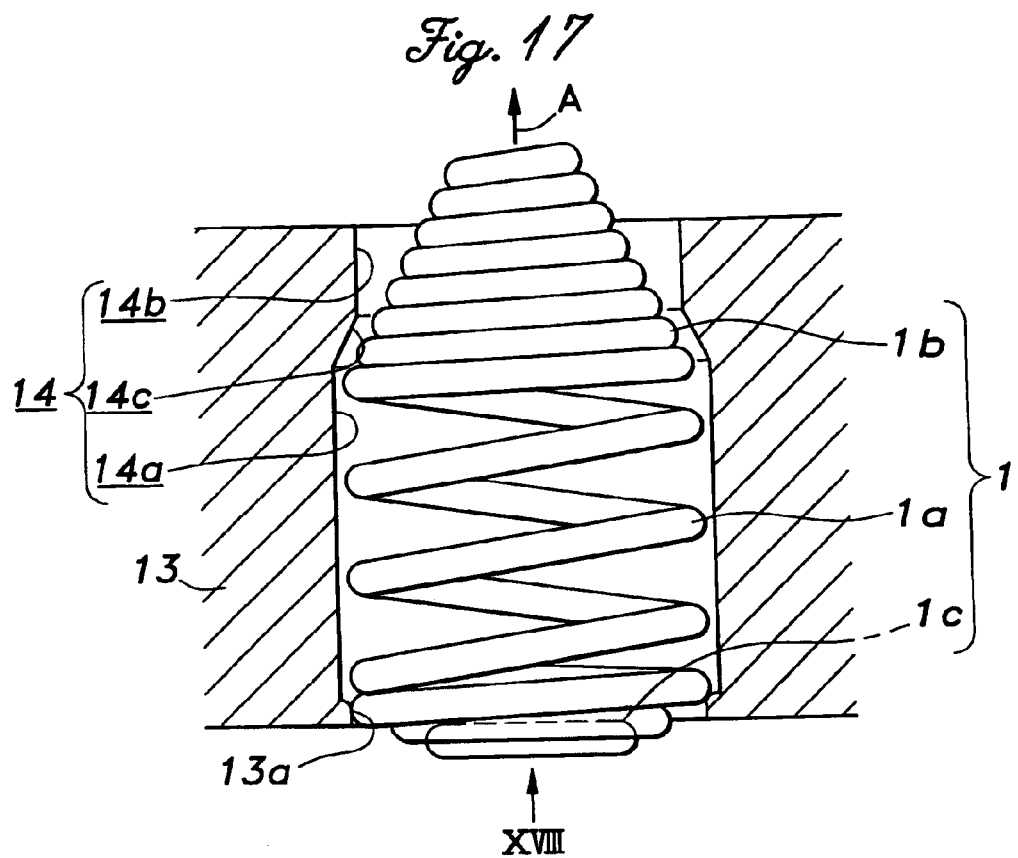
FIG. 17 is a view similar to FIG. 16 showing the mode of assembling the embodiment illustrated in FIG. 16.

Referring to FIG. 17, when placing the conductive coil contact member 1 in the holder hole 14, the conductive coil contact member 1 is fitted into the holder hole 14 from the large diameter end of the holder hole 14 with the conical electrode portion 1b first. The projections 13a engage the outer circumferential surface of the conductive coil contact member 1 and provide a certain resistance to the axial movement of the conductive coil contact member 1 in the holder hole 14. When the conductive coil contact member 1 is fully received in the holder hole 14, the conductive coil contact member 1 is firmly held in the holder hole 14, and this facilitates the assembly work. Thus, this embodiment provides similar advantages as the previous embodiment.

Figure 19:
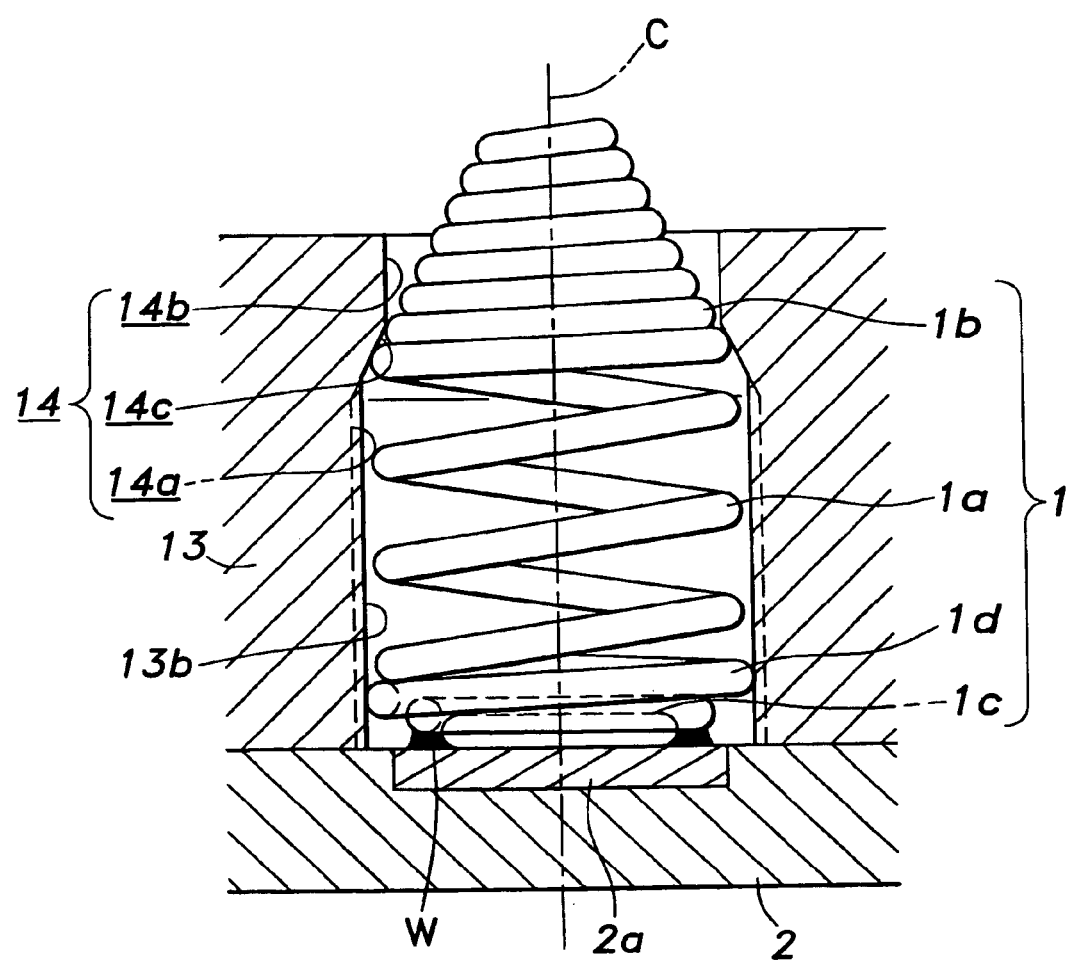
FIG. 19 is a view similar to FIG. 14 showing yet another embodiment of the contact probe head according to the present invention.
Figure 21:
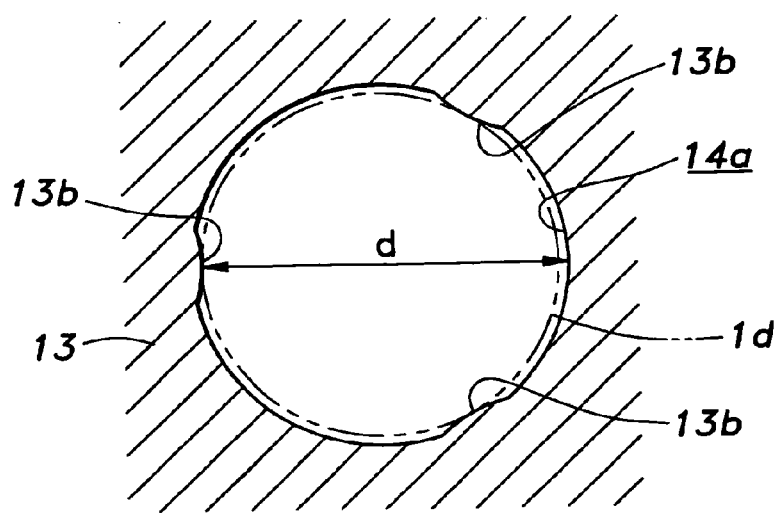
FIG. 21 is a sectional view taken along line XXI—XXI of FIG. 20.

FIG. 19 shows a ninth embodiment of the present invention in which the parts corresponding to those of the previous embodiments are denoted with like numerals. In this embodiment which is similar to the previous embodiment illustrated in FIGS. 16 to 18, the conductive coil contact member 1 consists of an upper conical electrode portion 1b, an intermediate compression coil spring portion 1a, a large diameter portion 1d consisting of about a single turn of the coil wire and a lower flat end portion 1c defining a flat coil end. The open end of the large diameter portion 14a of the holder hole 14 is provided with three axially extending radially inwardly directed projections 13b as shown in FIG. 21. The outer diameter of the large diameter portion 1d of the conductive coil contact member 1 is slightly larger than the diameter of a circle inscribed by the free ends of the projections 13b.

Figure 20:
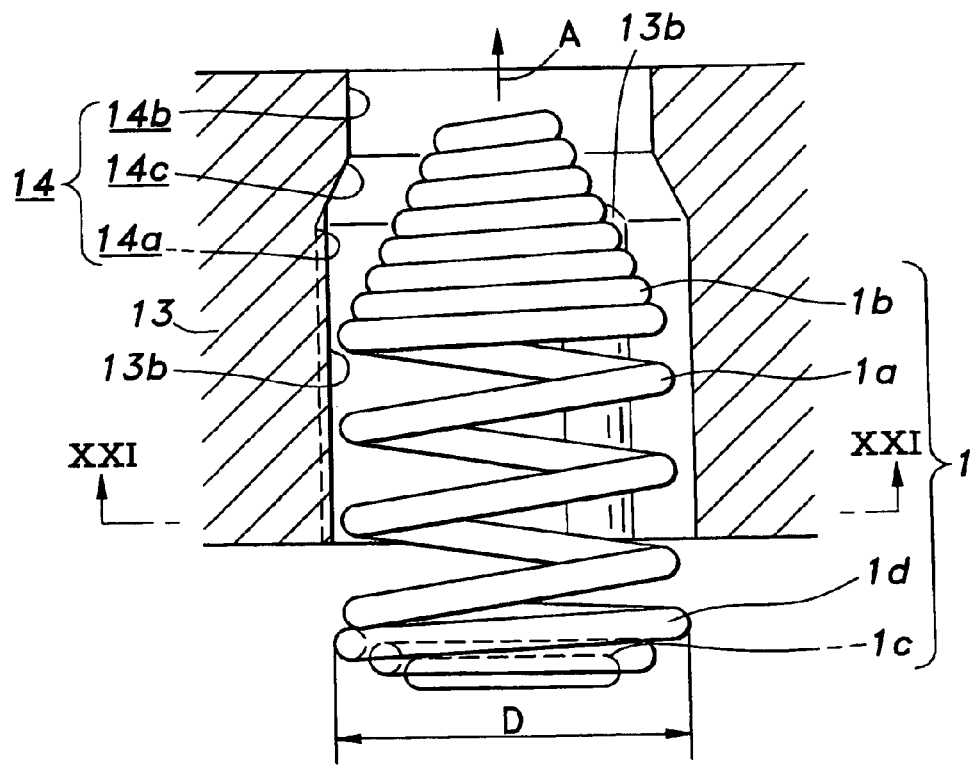
FIG. 20 is a view similar to FIG. 19 showing the mode of assembling the embodiment illustrated in FIG. 19.

Referring to FIG. 20, when placing the conductive coil contact member 1 in the holder hole 14, the conductive coil contact member 1 is fitted into the holder hole 14 from the large diameter end of the holder hole 14 with the conical electrode portion 1b first. The projections 13b engage the outer circumferential surface of the large diameter portion 1d of the conductive coil contact member 1 and provide a certain resistance to the axial movement of the conductive coil contact member 1 in the holder hole 14. When the conductive coil contact member 1 is fully received in the holder hole 14, the conductive coil contact member 1 is firmly held in the holder hole 14, and this facilitates the assembly work. Thus, this embodiment provides similar advantages as the previous embodiment.

The retaining force or resistance acting on the conductive coil spring 1 in the embodiments illustrated in FIGS. 14 to 21 should be such that the conductive coil spring 1 is retained in the holder hole 14 against the gravitational force or slight shaking. It is preferred to retain the conductive coil spring 1 in a precisely coaxial relationship with respect to the holder hole to ensure the positional accuracy of the free end of the upper electrode portion 1b. In the last embodiment, the three projections 13b contribute to the centering of the conductive coil spring 1 in the holder hole 14 without hampering the resilient action of the compression coil spring portion 1a.

The coil wire 4 in the foregoing embodiments had a circular cross section, but may also have rectangular or other cross sectional shapes. In the foregoing embodiments, only one of the electrode portions was soldered to the opposing terminal or the like, but depending on the application, the other electrode portion may be soldered to an object instead, or even both the electrode portions may be soldered to the corresponding objects. In the last case, the contact resistance can be totally eliminated, and the overall electric resistance can be minimized.

In the foregoing embodiments, the holder was formed by two insulating plate members or a single insulating plate member, but it is also possible to use three or more insulating plate members to form a holder. In such a case, the various portions of the holder hole having different inner diameters may be formed by a corresponding number of plate members formed with mutually aligned but different sized straight holes. In such a case, the work required for forming holes in the holder can be simplified.

Thus, according to the present invention, the free end of the electrode portion consists of a turn having an extremely small diameter for the given diameter of the coil wire, the positional accuracy of the contact end of the electrode portion can be increased. The plated layer also contributes to the reduction in the electric resistance of the conductive coil contact member.

If one end of the conductive coil contact member is solder to an object such as a terminal, the contact resistance can be avoided, and the overall electric resistance can be reduced. The soldering also improves the positional stability of the electrode portion against environmental changes or other interferences, and this contributes to the positional accuracy of the free end of the opposite electrode portion. If the two ends are both soldered, the contact pressure can be entirely eliminated and the positional stability can be even more enhanced.

The electrode portion of the conductive coil contact member which is soldered to an object such as a terminal may be formed by coiling the coil wire radially inward in a plane perpendicular to the axial line of the conductive coil contact member so as to define a flat end surface. This allows the conductive coil contact member to stand upright by itself, and enables the soldering work to be performed in a stable manner. Also, the flat end contributes to a favorable distribution of solder so as to achieve both mechanically and electrically stable connection.

If the compression coil spring portion of the conductive coil contact member is appropriately guided by the inner circumferential wall of the holder hole, the positional accuracy of the free end of the electrode portion can be ensured.

By providing radial projections in the inner circumferential surface of the holder hole or providing a large diameter portion having a slightly larger outer diameter than the inner diameter of the holder hole, the conductive coil contact member can be favorably retained in the holder hole so that the soldering work can be performed in a stable manner.

Although the present invention has been described in terms of preferred embodiments thereof, it is obvious to a person skilled in the art that various alterations and modifications are possible without departing from the scope of the present invention which is set forth in the appended claims.

What is claimed is:

1. A method of making a conductive coil contact member comprising a coil wire formed into a coil having at least one tapered end consisting of a plurality of turns of said coil wire having a progressively smaller coil radius toward a free end thereof, comprising:

coiling a core wire into a coil in such a manner that a last turn of said free end is given with a substantially smallest possible radius for a given wire diameter of said core wire; and forming an electrically conductive layer over said core wire at least at said free end so as to increase a diameter of said coil wire, said increased coil wire diameter being substantially greater than would be possible for said coil wire to be coiled and given with said smallest possible radius.

2. A method of making a conductive coil contact member according to claim 1, where a plurality of layers are formed over said core wire, said layers including at least one highly electrically conductive layer and at least one layer having a favorable mechanical property.

3. A method of making a conductive coil contact member according to claim 2, where said highly electrically conductive layer is made of a member selected from a group consisting of silver, silver alloy, copper and copper alloy.

4. A method of making a conductive coil contact member according to claim 2, where said layer having a favorable mechanical property is essentially made of nickel.

5. A method of making a conductive coil contact member according to claim 2, where said layers further include an outer layer made of a member selected from gold, gold alloy, rhodium and rhodium alloy.

6. A method of making a conductive coil contact member according to claim 2, where said core wire is made of steel.

7. A method of making a conductive coil contact member according to claim 1, where said layer continuously extends between adjacent turns of said coil wire.

8. A conductive coil contact member having at least one tapered end consisting of a plurality of turns of coil wire having a progressively smaller coil radius toward a free end thereof, wherein:

said coil wire includes a core wire and at least one electrically conductive layer formed over said core wire after said core wire has been coiled to a prescribed shape, a last turn of said coil wire at said free end having as small a coil radius as possible for the diameter of said core wire.

9. A conductive coil contact member according to claim 8, wherein the prescribed shape is a conical shape.

* * * * *